United States Patent [19]
Terahata

[11] Patent Number: 4,889,794
[45] Date of Patent: Dec. 26, 1989

[54] METHOD OF CHANGING THE DENSITY OF IMAGE ON SIMPLE COLOR PROOF USING A RANDOMLY DOTTED HALF TONE MASK

[75] Inventor: Masahiro Terahata, Tokyo, Japan

[73] Assignee: Fuji Photo Film Co., Ltd., Kanagawa, Japan

[21] Appl. No.: 214,063

[22] Filed: Jul. 1, 1988

Related U.S. Application Data

[63] Continuation of Ser. No. 884,340, Jul. 11, 1986, abandoned.

[30] Foreign Application Priority Data

Jul. 12, 1985 [JP] Japan .................. 60-152506

[51] Int. Cl.⁴ .............................. G03C 5/00
[52] U.S. Cl. ...................... 430/293; 430/257; 430/260; 430/396; 430/952
[58] Field of Search ............ 430/257, 293, 396, 952, 430/260

[56] References Cited

U.S. PATENT DOCUMENTS

| | | |
|---|---|---|
| 3,615,441 | 10/1971 | Deneau . |
| 4,262,071 | 4/1981 | Larson . |
| 4,339,525 | 7/1982 | Bratt et al. .................. 430/293 |
| 4,482,625 | 11/1984 | Namiki et al. ............... 430/143 |
| 4,537,470 | 8/1985 | Schoppmeyer ............. 350/317 |
| 4,571,373 | 2/1986 | Musser et al. .............. 430/293 |

Primary Examiner—Jack P. Brammer
Attorney, Agent, or Firm—Sughrue, Mion, Zinn, Macpeak & Seas

[57] ABSTRACT

A method of obtaining a color proof in which color-separated images are successively exposed onto colored light-sensitive layers. The layers are all transferred to a printing paper. The exposures are performed through a mask having dots of predetermined density and diameter, depending on the type of printing paper. If the color-separated images are positive, the dots are transparent on a dark background. If the color-separated images are negative, the dots are dark on a transparent background and additional exposures are made without the mask.

13 Claims, 1 Drawing Sheet

METHOD OF CHANGING THE DENSITY OF IMAGE ON SIMPLE COLOR PROOF USING A RANDOMLY DOTTED HALF TONE MASK

This is a continuation of application Ser. No. 884,340, filed 7/11/86 now abandoned.

DETAILED DESCRIPTION OF THE INVENTION

1. Field of the Invention

The present invention relates to a method of changing the density of an image on a simple color proof used in color printing, and to a mask for use in that method.

2. Background Art

Simple color proofs can be prepared by various methods, of which the overlaying process and the surprinting process are by far the most common. Simple color proofs are commercialized under such trade names as Color Key (3M), Chromalin (du Pont), Transfer Key (3M) and Color Art (Fuji Photo Film).

One of the greatest problems with the conventional methods of making simple color proofs is the difficulty in changing the densities of color proofs at will. This difficulty arises from the fact that the concentrations of colorants (e.g. dyes and pigments) incorporated in color proofs are predetermined. For instance, the maximum density (solid density) of image areas in a color proof are uniquely determined by the density of the colored film or colorant used. In order to change the density of the color proof, the density of the colored film or colorant used must be changed but this is cumbersome in actual practice. Therefore, it has long been desired to develop a method capable of easily changing in the density of a color proof prepared by the simplified color proofing process.

SUMMARY OF THE INVENTION

Accordingly, an object of the present invention is to solve the above described problem In particular, an object of the present invention is to provide a simple method of changing the density of an image on a color proof.

It has been found that the density of an image on a color proof can be readily changed by using a special mask in the image exposure step.

In one aspect of the present invention, a method of changing the density of an image on a simple color proof can simply make a color proof by exposing a light-sensitive material to prepare a color proof with a halftone image. The exposure employs a mask made of a transparent sheet which has about $10$–$10^4$ light-shielding dots per $cm^2$ of a diameter of about 5–300 micrometers when the exposure is made to a color-separated negative film. When the exposure is made through a color-separated positive film, the number and size of the dots are the same, but they are transparent dots on a mask of a light-shielding sheet.

The term "halftone image" as used in this specification shall be construed as applying to both color-separated halftone photography and alphanumeric images.

DETAILED DESCRIPTION OF THE PREFERRED EMBODIMENTS

Figure 1A:
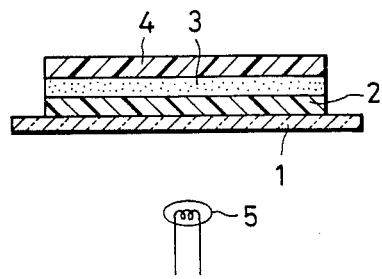
FIGS. 1(A) and (B) show two respective embodiments in which a color separation negative film is used in the exposure step performed in accordance with the present invention.

The present invention is hereunder described specifically with reference to the making of a simple color proof from a light-sensitive material containing a colorant. The process of preparing the proof includes the step of transferring the image to an image-receiving material. It should however be understood that the method of the present invention may be extensively used for the purpose of changing the density of a color proof which is being prepared by the simplified color proofing process including the step of exposing a color-separated halftone image to a light-sensitive material from which the color proof is to be made.

(1) Exposure Step

Four color-separated films are made from the original. They have yellow (Y), magenta (M), cyan (C) and black (B or K) colors, respectively. The films are then contact-exposed to light-sensitive materials constituting a color-proof which are dyed to yellow, magenta, cyan and black, respectively.

Each of the color-proof constituent light-sensitive materials has a light-sensitive layer dyed to one of the colors, yellow, magenta, cyan and black, which is formed on a plastic film base. The base is typically made of PET (polyethylene terephthalate). A release layer is inserted between the light-sensitive layer and the base. The colored light-sensitive layer contains not only a light-sensitive material (e.g. photopolymer) and a colorant (e.g. dye or pigment) but also other necessary components such as a binder. On the one hand, a resin that will harden upon illumination by light is used as the light-sensitive material in a negative-acting color-proof constituent light-sensitive material which is to be exposed from a color-separated film having a negative halftone image. On the other hand, a resin which will become soluble under illumination by light is preferably used in a positive-acting color-proof constituent light-sensitive material which is to be exposed through a color-separated film having a positive halftone image).

(2) Development Step

The four exposed light-sensitive materials are then developed (for example, with an alkali solution or an organic solvent) to provide positive relief images which are colored yellow, magenta, cyan and black, respectively.

(3) Transfer Step

The so formed yellow, magenta, cyan and black colored images are successively transferred onto an image-receiving material which is formed of an image-receiving layer on a plastic film base (temporary support), typically made of PET. Transfer may be effected by heating under pressure with an appropriate transfer apparatus such as a laminator. As a result of transfer, a full-colored image is formed on the receiving layer.

In the next phase, the image-receiving material is superimposed on printing paper such as wood-free paper with the image-receiving layer facing down, and the temporary support is separated from the image-receiving layer to leave the image-receiving layer on the printing paper. The printing paper may be given any necessary post-treatments to provide a finished color proof.

Details of these procedures and the materials used therefor may be found in Japanese Unexamined Published Application No. 97140/1984.

In the method described above, the color image formed on the image-receiving material is transferred to printing paper as a result of transfer of the image-receiving layer itself. This means that the color density of the transferred image is substantially fixed and color proofs of essentially the same tone will be obtained irrespective of whether the printing paper is art paper, wood-free paper, or woody (ground wood) paper.

However, in the actual case of printing, the color density obtained will depend on the type of printing paper even if the same type of ink and printing conditions are employed. Stated more specifically, color printing on art paper will produce a different color density than when printing is done on wood-free paper or woody paper under the same conditions. In the latter case, lower yellow, magenta, cyan and black color densities result because of such factors as the unevenness of the paper surface and ink penetration. For instance, if color printing on art paper produces color densities which are approximately $Y=0.94$, $M=1.30$, $C=1.54$ and $B=1.79$, printing on wood-free paper which is performed under the same conditions will provide lowered densities which are approximately $Y=0.90$, $M=1.23$, $C=1.43$ and $B=1.64$.

Therefore, in the making of color proofs, the final color density is required to have different values as between the case where art paper is used as the printing paper and the case where wood-free paper or woody paper is used. However, as already mentioned, the color proofs prepared by the prior art techniques are by no means appropriate since they have substantially the same color densities.

The simplified color proofing process presupposes the use of printing paper of the class of art paper as a standard. So, in order to avoid the aforementioned problem, the making of a color proof with wood-free paper or woody paper being used as the printing paper must be so performed that the density of the final color image is lowered to a level which is suitable for actual printing on wood-free paper or woody paper.

This requirement can be readily met by using the special mask of the present invention in the exposure step (1) in one of the processes which are described below with reference to the accompanying drawings.

FIGS. 1(A) and (B) show embodiments in which exposure is performed with a color-separated negative film. As shown in FIG. 1(A), a printer glass plate 1 carries thereon a yellow, magenta, cyan or black separation negative film 2, a negative mask 3 (dark dots on a transparent background) of the present invention, and a light-sensitive material 4 for making a color proof. Exposure is made through the printer glass plate 1 under illumination by a light source 5. This operation is repeated for each of the required color separation negative films using the light-sensitive materials for making the intended color proofs.

Each of the color separation negative films has a halftone image corresponding to the separated color. If exposure to these negatives is made using the mask of the present invention which has preselected size and number of light-shielding (non-transmitting) dots in accordance with the type of printing paper, a color proof having a desired color density can be finally obtained.

For instance, if a negative mask prepared by the method which will be specifically described below is used during exposure, a satisfactory color proof is obtained whose tone reproduction is substantially the same as that of a print on wood-free paper.

Therefore, in the present invention, proper adjustment (change) of the density of a color proof can be made in accordance with the type of printing paper selected and the color proof obtained has a tone which is faithful to the color image actually formed on that printing paper.

Figure 1B:
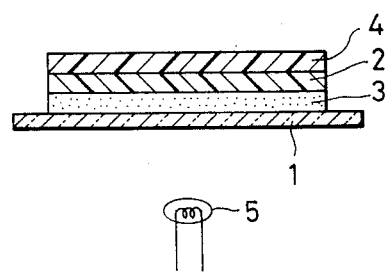

FIG. 1(B) shows another embodiment in which a color separation negative film is used in the exposure step performed in accordance with the present invention. This embodiment differs from the one shown in FIG. 1(A) in that the negative film 2 and the mask 3 of the present invention are reversed in position.

Figure 2B:
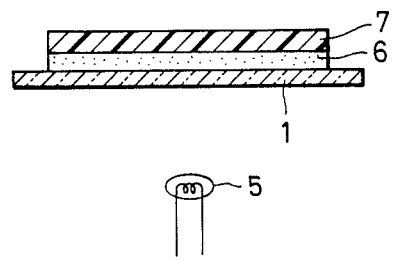
FIGS. 2(A) and (B) show one embodiment in which a color separation positive film is used in the exposure step performed in accordance with the present invention.
Figure 2B:
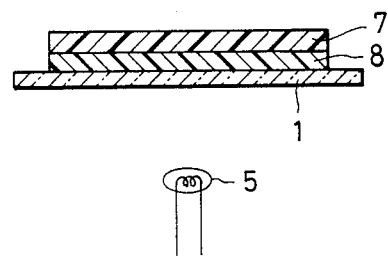

FIG. 2 shows an embodiment in which a color separation positive film, rather than a negative film, is used in the exposure step performed in accordance with the present invention. As sown in FIG. 2(A), a printer glass plate 1 carries thereon a positive mask 6 (transparent dots on a dark background) of the present invention and a positive-acting light-sensitive material 7 for making a color proof, and exposure is made through the printer glass plate by illumination under a light source 5. In the next phase, the mask-exposed light-sensitive material 7 and a color separation positive film 8 are stacked on another printer glass plate 1 as shown in FIG. 2(B) and illuminated under a light source 5. In this embodiment, two exposures are made but the order of steps (A) and (B) is not critical. By following the procedures described above, a color proof can be made from a color separation positive film, with the color density of the proof being properly adjusted (changed) by using the positive mask of the present invention.

The special masks of the present invention have the characteristics described above and are preferably in the form of a plastic or glass sheet. Any of the known methods may be employed to prepare the special mask of the present invention. For example, a random array of dots are formed on a light-sensitive film with a dot generator, a grained contact screen is printed onto a light-sensitive film. Alternatively, more than 300 line rulings are formed.

One method of forming a negative-acting mask is described below. A random array of dots with a covering of 90% dot area are generated with a commercial scanner. The dots are printed onto a commercial scanner film, which is developed by standard techniques. The random dot film obtained is subjected to three exposures in a commercial daylight printer so as to prepare the desired negative-acting mask.

A mask having a desired number of dots and a desired degree of uniformity in dot array can be obtained by properly adjusting the dot area (e.g. 60–99%), the time of multiple exposures, and the number of exposures.

A positive-acting mask may be readily formed by "reversing" the negative mask by routine procedures.

The dots, whether dark or transparent, should have a density on the mask within the range of $10$–$10^4$ per $cm^2$ and should have diameters in the range of 5–300 micrometers. Preferably the range of diameters is 5–100 micrometers.

As will be apparent from the foregoing description, the procedures for preparing a simple color proof according to the present invention may be the same as those employed in the prior art process except that the special mask or the present invention is used in the exposure step.

While several preferred embodiments of the present invention are explained above, it should be noted that various other embodiments are possible by employing any of the known techniques with respect to the type and number of color separations, the type of the light-sensitive material used for making a color proof, the type of image-receiving material, the method of coloring, the method of processing, and the method of transfer.

The mask of the present invention to be used in the exposure step may be the same for all of the color separation films or, alternatively, masks having different characteristics may be selectively used for the individual color separation films.

In accordance with the present invention, a simple color proof can be prepared by readily changing the desired color density such that it has a tone which is faithful to the color image to be formed in actual printing.

I claim:

1. A method of obtaining a color proof, comprising the steps of:
   (A) exposing a plurality of light-sensitive layers which are provided on respective bases, to respective color-separated images of a color image, wherein said light-sensitive layers comprise:
      (i) a photolytic polymer as a light-sensitive material,
      (ii) a colorant, and
      (iii) a binder, and wherein each of said light-sensitive layers contains a different colorant which produces a color selected from the group consisting of yellow, magenta, cyan and black;
   (B) developing said light-sensitive layers; and
   (C) transferring said developed light-sensitive layers successively in registration onto an image-receiving material comprising an image-receiving layer provided on a base; and
   (D) transferring the resulting image-receiving layer of step (C) to a printing paper to obtain a color proof; wherein said exposing includes exposing at least one of said light-sensitive layers through a randomly dotted half-tone mask having dots of a first transmissivity on a background of a second transmissivity, wherein said dots are randomly at a density on the randomly dotted half-tone mask in the range of $10-10^4$ per $cm^2$ and have diameters in the range of 5-300 micrometers, wherein said color-separated images are positive color separated film and said first transmissivity of said dots is greater than said second transmissivity of said background, and wherein said exposing step includes a first exposing step of exposing said light-sensitive layers to said respective color-separated images without passing said respective color-separated images through a randomly dotted half-tone mask and a second exposing step of exposing said light-sensitive layers to uniform illumination projected through said randomly dotted half-tone mask.

2. A method as recited in claim 1, wherein said first exposing step is performed before said second exposing step.

3. A method as recited in claim 2, wherein said range of diameters is 5-100 micrometers.

4. A method as recited in claim 2, wherein said first transmissivity of said dots is substantially transparent and said second transmissivity is substantially light shielding.

5. A method as recited in claim 2, further comprising the step of selecting a half-tone mask having a predetermined density of said dots and a predetermined range of diameters of said dots in accordance with a characteristic of said printing paper.

6. A method as recited in claim 1, wherein said second exposing step is performed before said first exposing step.

7. A method as recited in claim 6, wherein said range of diameters is 5-100 micrometers.

8. A method as recited in claim 6, wherein said first transmissivity of said dots is substantially transparent and said second transmissivity is substantially light shielding.

9. A method as recited in claim 6, further comprising the step of selecting a mask having a predetermined density of said dots and a predetermined range of diameters of said dots in accordance with a characteristic of said printing paper.

10. A method of obtaining a color proof, comprising the steps of:
    (A) exposing a plurality of light-sensitive layers which are provided on respective bases, to respective color-separated images of a color image, wherein said light-sensitive layers comprise:
       (i) a photo polymer selected from the group consisting of a photopolymerizable polymer and a photocrosslinkable polymer as a light-sensitive material,
       (ii) a colorant, and
       (iii) a binder, and wherein each of said light-sensitive layers contains a different colorant which produces a color selected from the group consisting of yellow, magenta, cyan and black;
    (B) developing said light-sensitive layers; and
    (C) transferring said developed light-sensitive layers successively in registration onto an image-receiving material comprising an image-receiving layer provided on a base; and
    (D) transferring the resulting image-receiving layer of step (C) to a printing paper to obtain a color proof; wherein said exposing includes exposing at least one of said light-sensitive layers through a randomly dotted half-tone mask having dots of a first transmissivity on a background of a second transmissivity, wherein said dots are randomly at a density on the randomly dotted half-tone mask in the range of $10-10^4$ per $cm^2$ and have diameters in the range of 5-300 micrometers and wherein said color separated images are negative color-separated images and said first transmissivity of said dots is less than said second transmissivity of said background- and wherein said exposing step includes exposing said light-sensitive layers to said respective color-separated images through said randomly dotted half-tone mask.

11. A method as recited in claim 10, wherein said range of diameters is 5-100 micrometers.

12. A method as recited in claim 10, wherein said first transmissivity of said dots is substantially light shielding and said second transmissivity of said background is substantially transparent.

13. A method as recited in claim 10, further comprising the step of selecting a half-tone mask having a predetermined density of said dots and a predetermined range of diameters of said dots in accordance with a characteristic of said printing paper.

* * * * *